United States Patent [19]

Mazura et al.

[11] Patent Number: 5,488,543
[45] Date of Patent: Jan. 30, 1996

[54] FRAME STAND

[75] Inventors: Paul Mazura, Karlsbad; Hans-Martin Schwenk, Straubenhardt, both of Germany

[73] Assignee: Schroff GmbH, Straubenhardt, Germany

[21] Appl. No.: 310,794

[22] Filed: Sep. 29, 1994

[30] Foreign Application Priority Data

Oct. 6, 1993 [DE] Germany .......................... 43 33 947.6
Apr. 2, 1994 [DE] Germany .......................... 94 05 618 U

[51] Int. Cl.6 .................................................. H02B 1/01
[52] U.S. Cl. ..................... 361/829; 361/752; 361/796; 361/831; 211/41; 312/265
[58] Field of Search ................................... 361/829, 752, 361/753, 796, 797, 802, 831; 312/265, 264, 266; 211/41; 248/65, 121, 127; 174/17 R

[56] References Cited

U.S. PATENT DOCUMENTS

| 3,657,608 | 4/1972 | Leone et al. ........................ 317/118 |
| 4,040,694 | 8/1977 | Lascarrou ............................. 312/263 |
| 5,250,752 | 10/1993 | Cutright ............................... 174/35 R |

FOREIGN PATENT DOCUMENTS

| 0577433 | 1/1994 | European Pat. Off. . |
| 1228231 | 4/1971 | United Kingdom . |
| 2052878 | 1/1981 | United Kingdom . |

*Primary Examiner*—Leo P. Picard
*Assistant Examiner*—Y. Whang
*Attorney, Agent, or Firm*—Spencer, Frank & Schneider

[57] ABSTRACT

A frame stand for a device cabinet which has panels and serves in the installation of component carriers of industrial electronics. Four posts extend between a lower base plate and an identically-configured lid plate. To attach the panels, front brackets and rear brackets project from the base plate and the lid plate; these brackets are aligned with one another, and form recesses for cable harnesses.

14 Claims, 3 Drawing Sheets

FRAME STAND

CROSS-REFERENCE TO RELATED APPLICATION

This application claims the priority of patent application Ser. No. P 43 33 947.6, filed Oct. 6, 1993, in Germany, the subject matter of which is incorporated herein by reference.

BACKGROUND OF THE INVENTION

The invention relates to a frame stand for a device cabinet provided with panels and serving in the installation of component carriers of industrial electronics.

The frame stand according to the present invention is used in device cabinets for receiving electrical, electronic and optoelectronic components in connection with the establishment and operation of local networks in which high cable densities are required and large-diameter cables are used.

There exist frame stands of device cabinets for industrial electronics in which component carriers are disposed, together with a wiring field, the peripheral connector field, the fans and other accessories. Such frame stands have a floor and a cover in the shape of twist-resistant, horizontal frames which comprise four beams that are connected to one another by four vertical posts. The components are secured between the posts. To create the closed device cabinet, panels in the form of side walls, a rear wall, floor plate and cover plate and a door are secured directly to all sides of the frame stand. Because only a few lines are required for external cabling of the installed electrical and electronic components, it is not difficult to thread the relatively thin cable strands into the housing and guide them inwardly through small openings or special leadthroughs.

Conventional frame stands are not suitable for device cabinets when large quantities of cable must be laid and distributed, and the cable is of a larger diameter and therefore less flexible. Local networks require free access for many cables of varying thickness into the installation region of the electrical and electronic components, as well as the distribution plates (patch fields) in the device cabinet. Stiff cables cannot be threaded into device cabinets constructed with known frame stands and laid in their interior. This is where the invention comes in.

SUMMARY OF THE INVENTION

The object to be accomplished by the invention is to configure a frame stand for device cabinets of industrial electronics in such a way that all requirements of free feed-in of a large number of cable strands of low flexibility into the installation region of the electrical/electronic elements are met.

To accomplish the object, the point of departure is a frame stand of a typical construction. The object is accomplished by a stand having a lower base plate, an upper lid plate, and parallel posts of equal length extend between the base plate and lid plate. The end faces on both sides of the posts have fastening bores, the base plate and lid plate have groups of fastening holes, the base plate and the lid plate are fixedly connected to the posts by means of fastening screws that pass through the fastening holes and extend into the fastening bores, the base plate and lid plate are essentially formed by a fastening plate that has a rectangular base outline and has groups of fastening holes, two front brackets which form a front recess between themselves project at a right angle to the one longitudinal side of the base plate and lid plate, on the opposite longitudinal side of the base plate and lid plate, two rear brackets that form a rear recess between themselves project at a right angle, and the front and rear brackets are formed onto the ends of the longitudinal sides, with one front and one rear bracket being aligned.

According to another feature of the present invention, the arrangment incorporates a base plate and lid plate which permit the supporting posts to be relocated toward the inside, and, on their longitudinal sides between the front and rear brackets, permit the formation of wide and sufficiently deep recesses for the cable harnesses, which can thus be guided unimpaired into the installation regions of the components. The cable assembly can take place here on the open frame stand equipped with the components. After assembly work, the panels are first secured to the brackets with sufficient spacing from the installed devices, so that the construction of the protective cabinet takes place as the final work cycle prior to shipping. The posts can be arranged inside the groups of fastening holes such that the interior structure can correspond to different standards, such as the 19-inch standard or the metric system.

Four profiled rails may serve as posts. These rails are configured such that the devices to be installed and other elements can be secured at arbitrary heights.

Instead of four posts, two supporting walls can be used which have an elongated, rectangular lateral outline and face one another in a 19-inch or metric grid.

To attach the posts or supporting walls, respectively, they may be provided on their end faces with two adjacent fastening bores, which also prevent twisting during or after assembly. The fastening screws can be provided with self-cutting threads.

To facilitate assembly, the fastening bores are generally provided with inside threads for the fastening screws.

To improve the cooling of the components inserted between the posts, both the base plate and the lid plate have a preferrably circular ventilation opening through which that axial fans can be inserted without problems.

According to a further feature of the invention, the base plate and lid plate have edge recesses on their narrow sides. These recesses permit the direct feed-in of cable harnesses to the components in the frame stand from the side.

The outer sides of the front and rear brackets may be disposed in such a way that they are aligned with the narrow sides of the base plate and lid plate.

The base plate and the lid plate may be made of one piece by way of aluminum diecasting, which brings about high resistance to twisting. Alternatively, these two parts can be assembled from deep-drawn sheet steel or stamped parts, e.g. by means of welding.

The two front brackets of the base plate and lid plate can be configured considerably shorter than the respective rear brackets. This takes into consideration the fact that less space is required for feeding the cable on the frontage of the components to be installed than for the rear side.

In the interest of economical production, the base plate and the lid plate are preferably configured so as to be identical. According to a further feature of the invention, the base plate and lid plate have an edge strip which extends all the way around.

The edge strip may be configured to be at the same height all the way around, and is attached to the base plate essentially at a right angle between the lid plate.

The panels of the device cabinet, whose supporting component is the proposed frame stand, are attached to the base plate and the lid plate, namely, the two side panels, the one- or multiple-part floor panel, the lid panel, the rear wall and one or more hinged doors.

BRIEF DESCRIPTION OF THE DRAWINGS

The above and other features and advantages of the present invention will be further understood from the following detailed description of the preferred embodiments with reference to the accompanying drawings in which.

DETAILED DESCRIPTION OF THE PREFERRED EMBODIMENTS

Figure 1:
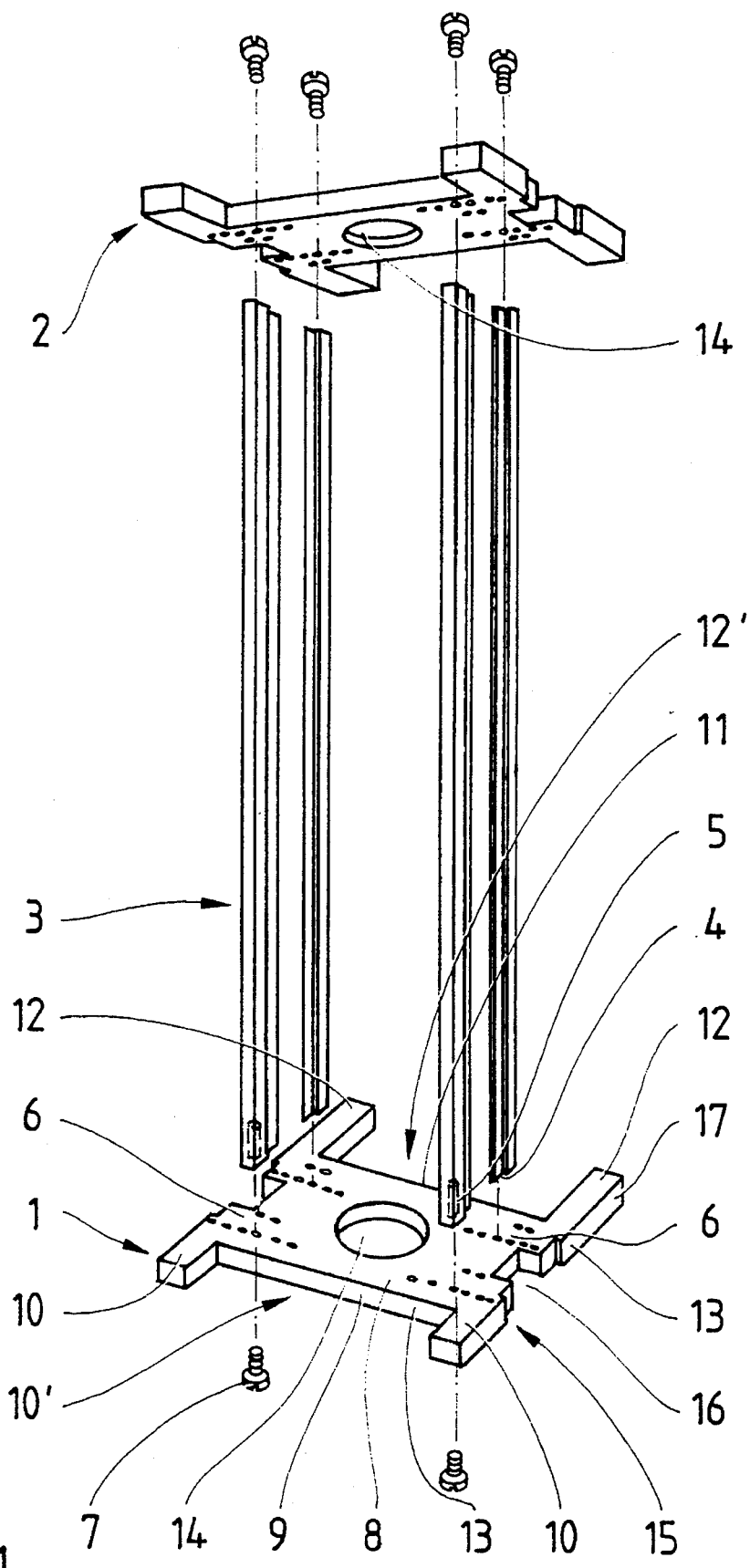
FIG. 1 shows an explosion-type view in perspective of a frame stand having four profiled rails as posts.

The frame stand illustrated in FIG. 1, which is provided as the supporting structure for a device cabinet that serves in the installation of component carriers and other industrial electronics components, comprises a lower base plate 1, an upper lid plate 2 and four posts 3.

Base plate 1 and lid plate 2 are manufactured in one piece, are made of aluminum diecasting and are configured to be identical. Posts 3 are profiled rails made of extruded aluminum. The component carriers (not shown) can be inserted between these posts 3 at arbitrary heights and secured; to this end the posts have rows of holes or T-grooves for the insertion of threaded parts.

The four parallel posts 3, which are of equal length, extend between base plate 1 and lid plate 2, and have four fastening bores 5 on their end faces on both sides. The lower base plate 1 and the upper lid plate 2 have groups of fastening holes 6. Base plate 1 and lid plate 2 are fixedly connected with the four posts 3 by means of fastening screws 7, which pass through fastening holes 6 of base plate 1 and lid plate 2 and extend into fastening bores 5 of the posts.

Base plate 1 and lid plate 2 are formed by a fastening plate 8, which has an essentially rectangular base outline and has groups of fastening holes 6. The arrangement of the fastening holes is selected such that the four posts 3 can be screwed onto base plate 1 and lid plate 2 corresponding to the width and depth of the standardized component carriers to be inserted.

Two front brackets 10 project at a right angle to the one (front) longitudinal side 9 of base plate 1 and lid plate 2 (or fastening plate 8, respectively), and on the opposite (rear) longitudinal side 11, two (rear) brackets 12 project at a right angle to longitudinal side 11. Both the two front brackets 10 and the two rear brackets 12 are formed onto the ends of longitudinal sides 9 or 11, respectively, of fastening plate 8 in such a way that a front bracket 10 is respectively aligned with a rear bracket 12, and a front recess 10' or rear recess 12' is formed between them. Base plate 1 and lid plate 2 demonstrate, together with their respective four brackets 10 and 12, a base outline that is comparable to a wide "H."

Base plate 1 and lid plate 2 each have an edge strip 13, which extends all the way around at the same height and is formed onto or attached right angle to the two longitudinal sides 9 and 11, as well as all sides of the four brackets 10 and 12. Base plate 1 and lid plate 2 are configured to have thin walls, and they represent low, H-shaped troughs which are open to the bottom or top. Reinforcement ribs (not visible) are disposed inside the troughs.

Figure 2:
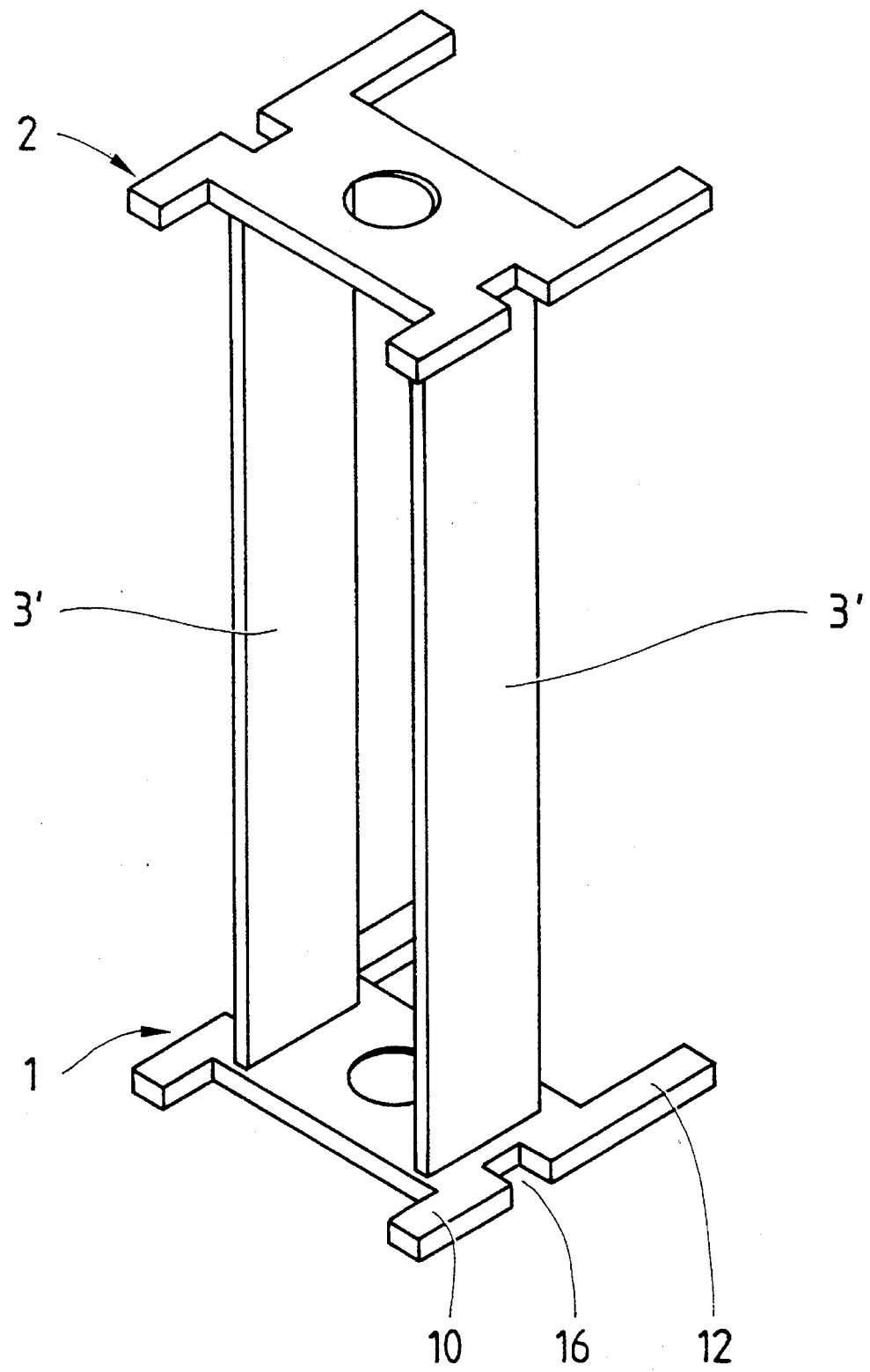
FIG. 2 shows a view in perspective of a frame stand having two supporting walls as posts.

Instead of the four posts 3, the arrangement may have two parallel supporting walls 3' that have an elongated, rectangular lateral outline and that are spaced opposite the components to be installed, as shown in FIG. 2. These walls 3' are arranged between the base plate and lid plate 2 and are configured as hollow profiles.

Both base plate 1 and lid plate 2 have a circular ventilation opening 14. In addition, base plate 1 and lid plate 2 have on their narrow sides 15 edge recesses 16, which have a rectangular base outline. The outer sides 17 of brackets 10 and 12 are aligned with these narrow sides 15.

The two front brackets 10 of base plate 1 and lid plate 2 are shorter than the two rear brackets 12.

Figure 3:
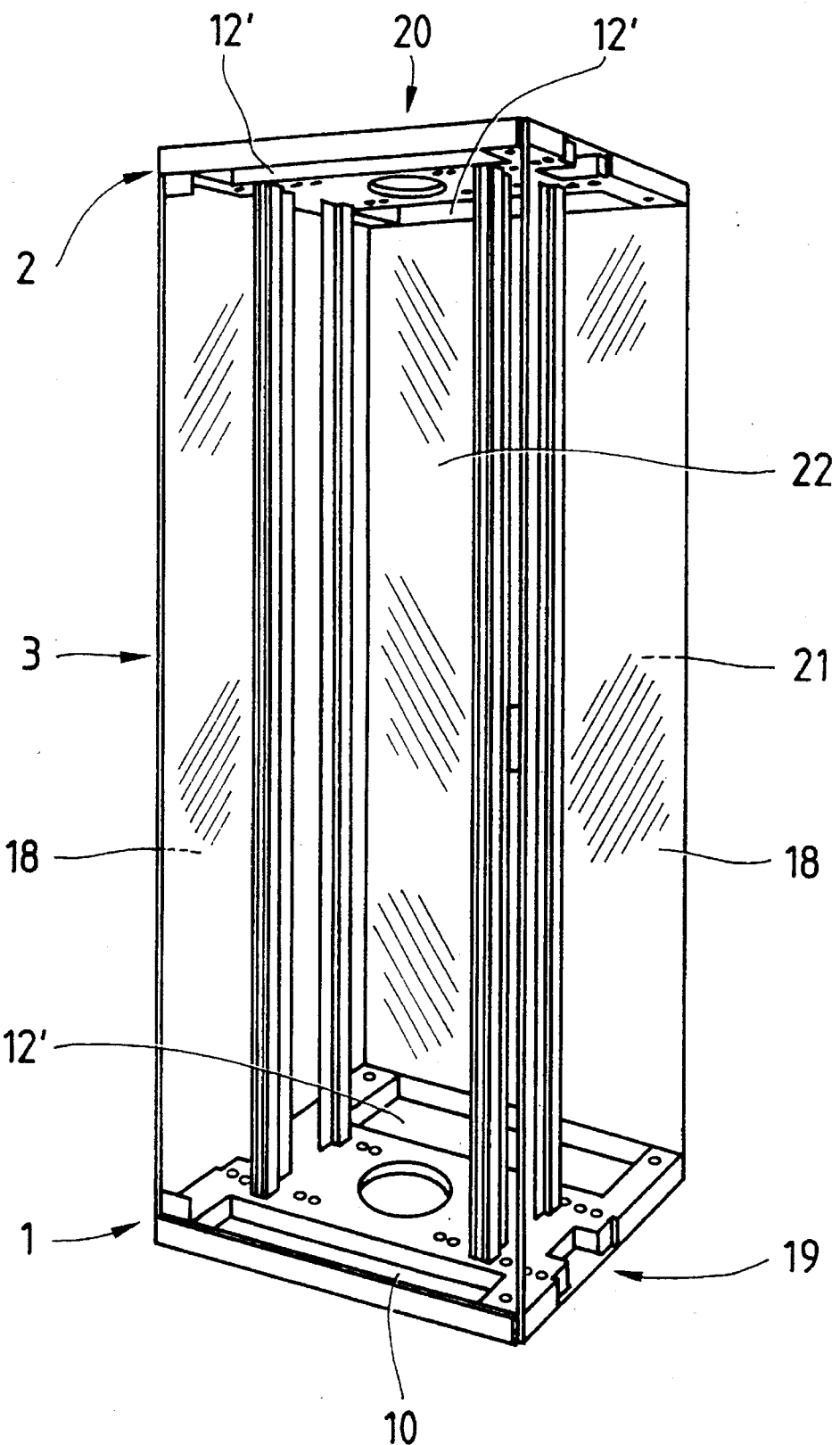
FIG. 3 shows a device cabinet constructed with a frame stand according to FIG. 1, with its panels being shown as being transparent.

FIG. 3 illustrates a device cabinet for the installation of component carriers and other electrical and electronic components that has as the supporting element a frame stand according to FIG. 1. The panels of this device cabinet, namely, the side panels 18, floor panel 19, cover panel 20, rear wall 21 and door 22 are directly secured or attached to edge strips 13 of base plate 1 and lid plate 2, namely to their front and rear brackets 10 and 12, or their narrow sides 15. Wide recesses 10' and 12' are configured between the front and rear brackets 10 and 12, both on base plate 1 and lid plate 2; these recesses, like edge recesses 16, permit unimpaired insertion and laying of very complex cable harnesses toward the assemblies and components from below, from above and from both sides.

It will be understood that the above description of the present invention is susceptible to various modifications, changes and adaptations, and the same are intended to be comprehended within the meaning and range of equivalents of the appended claims.

What is claimed is:

1. A frame stand for a device cabinet serving in the installation of component carriers of industrial electronics, and which is provided with panels, comprising: a lower base plate; an upper lid plate; parallel posts of equal length extending between the base plate and lid plate, the end faces on both sides of the posts have fastening bores; said base plate and lid plate having groups of fastening holes; said base plate and lid plate being fixedly connected to the posts by fastening screws which pass through the fastening holes and extend into the fastening bores; said base plate and lid plate being essentially formed by a fastening plate which has a rectangular base outline and groups of fastening holes; two front brackets that form a front recess between themselves and projecting at a right angle to the one longitudinal side of the base plate and the lid plate; two rear brackets arranged on the opposite longitudinal side of the base plate and lid plate, said rear brackets forming a rear recess between themselves and projecting at a right angle; said front and rear brackets being formed onto the ends of the longitudinal sides; and, one front and one rear bracket are aligned respectively with one another.

2. A frame stand as defined in claim 1, wherein these are four profiled rails serving as said posts.

3. A frame stand as defined in claim 1, wherein two supporting walls located opposite one another and having an elongated, rectangular lateral outline serve as the posts.

4. A frame stand as defined in claim 1, wherein two adjacent fastening bores are provided on each end face of the posts.

5. A frame stand as defined in claim 1, wherein the fastening bores are provided with inside threads for the fastening screws.

6. A frame stand as defined in claim 1, wherein said base plate and lid plate each have a ventilation opening.

7. A frame stand as defined in claim 1, wherein said base plate and lid plate have edge recesses on their narrow sides.

8. A frame stand as defined in claim 7, wherein the outer sides of the front and rear brackets are aligned with the narrow sides of said base plate and lid plate.

9. A frame stand as defined in claim 1, wherein said base plate and lid plate are made of aluminum diecast one piece.

10. A frame stand as defined in claim 1, wherein said front brackets are shorter than said rear brackets.

11. A frame stand as defined in claim 1, wherein said base plate and the lid plate have identical configurations.

12. A frame stand as defined in claim 1, wherein said base plate and lid plate each having an edge strip that extends all the way around.

13. A frame stand as defined in claim 12, wherein said edge strip is at the same height all the way around and is attached at an essentially right angle.

14. A frame stand as defined in claim 1, wherein said panels of the device cabinet are connected to said base plate or lid plate in the form of side panels, floor panels, cover panels, a rear wall and a door.

* * * * *